United States Patent [19]
Miller et al.

[11] Patent Number: 5,245,296
[45] Date of Patent: Sep. 14, 1993

[54] AUDIO AMPLIFIER CIRCUIT AND METHOD OF OPERATION

[76] Inventors: Francis A. Miller; Steven D. Heidorn, both of P.O. Box 246, Kenwood, Calif. 95452

[21] Appl. No.: 911,917
[22] Filed: Jul. 10, 1992
[51] Int. Cl.⁵ ............................................. H03F 1/34
[52] U.S. Cl. .................................... 330/85; 330/102; 330/105; 381/96; 381/121
[58] Field of Search ................ 330/85, 102, 105; 381/96, 121

[56] References Cited
U.S. PATENT DOCUMENTS
3,889,060  6/1975  Goto et al. ........................ 330/85 X
5,031,221  7/1991  Yokoyama ............................ 381/96

FOREIGN PATENT DOCUMENTS
2235664  1/1974  Fed. Rep. of Germany ........ 330/85

Primary Examiner—James B. Mullins
Attorney, Agent, or Firm—Flehr, Hohbach, Test, Albritton & Herbert

[57] ABSTRACT

An audio amplifier circuit which improves the efficiency, performance and power in a loudspeaker system. The circuit includes a discriminator differential amplifier which senses the motional voltage from the moving coil of a loudspeaker. The output signal from the differential amplifier is processed by the circuit into a correction voltage which is combined with the drive voltage and applied to the input of the loudspeaker.

3 Claims, 3 Drawing Sheets

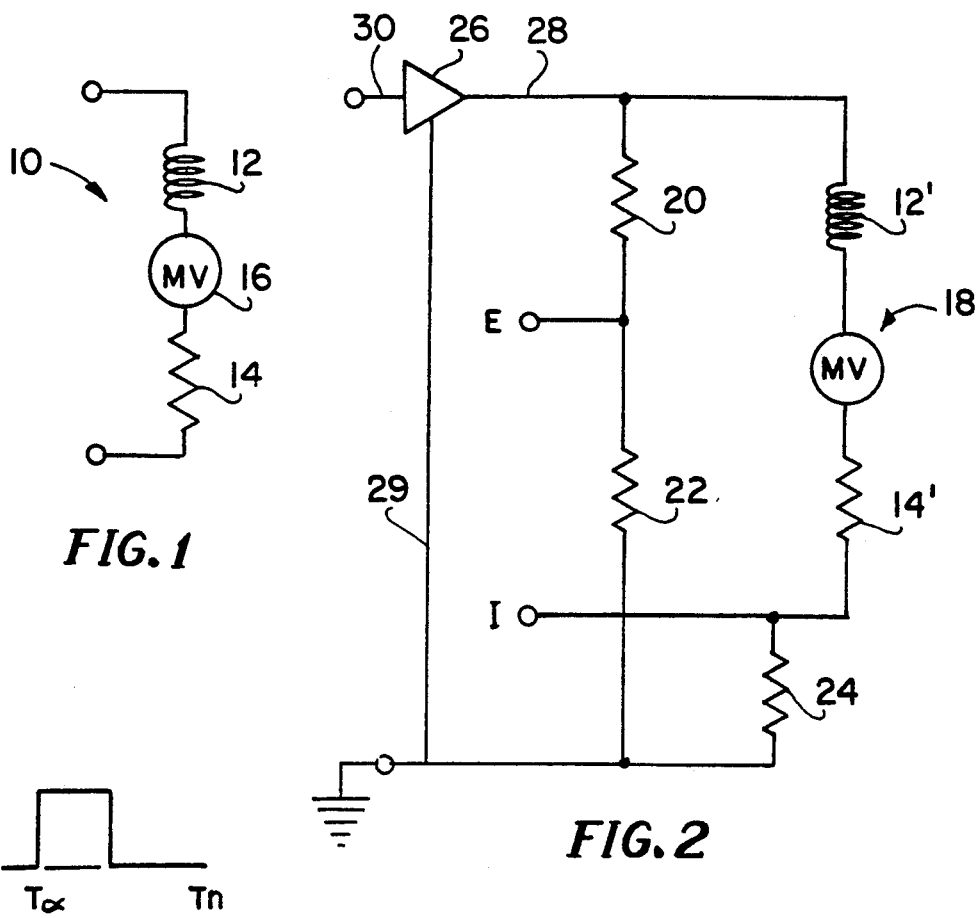
FIG.1
FIG.2
FIG.3A
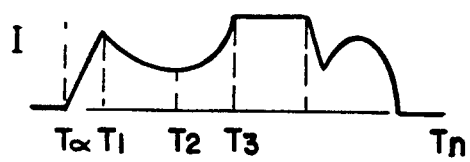
FIG.3B
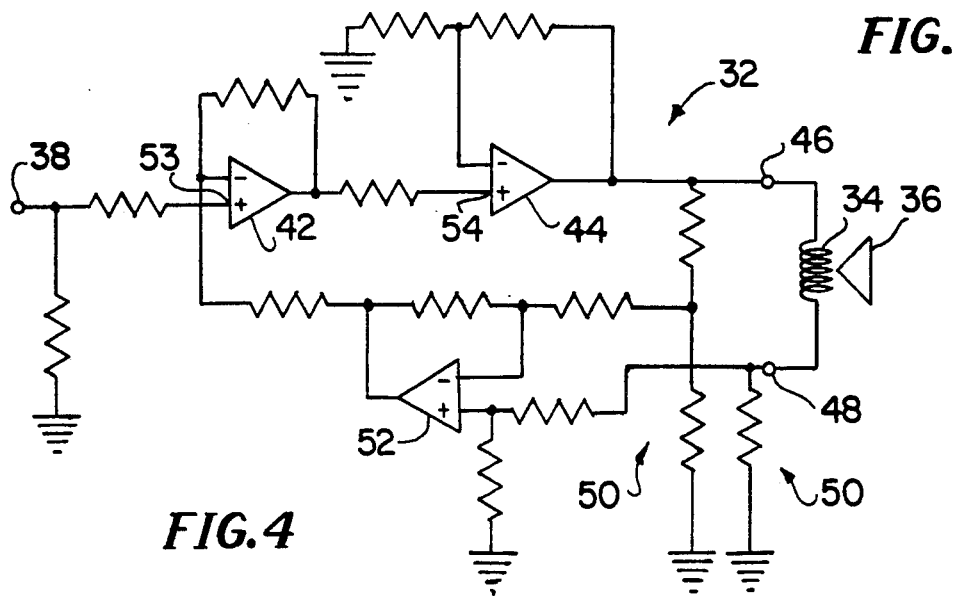
FIG.4

AUDIO AMPLIFIER CIRCUIT AND METHOD OF OPERATION

BACKGROUND OF THE INVENTION

1. Field of the Invention

The present invention relates to audio amplifier circuits, and more particularly relates to an amplifier circuit and method for improving the efficiency, performance and power of amplifier circuits for driving loudspeakers.

2. Description of the Prior Art

Electromechanical transducers, such as loudspeakers, can be considered equivalent to linear electric motors. By analogy to such an equivalent electric motor, electrical energy (watts) passes through the voice coil of a loudspeaker, causing the coil, and anything attached to it, to move. As the coil moves through the magnetic field an electrical voltage is generated in the coil. In order for the exact values of electrical power flowing through the coil to be calculated this generated voltage must be considered.

FIG. 1 illustrates the equivalent electrical properties of a typical prior art loudspeaker circuit 10. In the circuit inductor 12 represents the electrical inductance of the coil. Resistor 14 represents the DC resistance of the coil, and 16 represents the voltage generated by the motion of the coil in the magnetic field.

FIG. 2 shows a schematic equivalent circuit 18 which illustrates the effect the generated voltage has on the electrical power in a loudspeaker coil. A pair of voltage dividing resistors 20 and 22 as well as a current sampling resistor 24 are added to the inductor 12' and resistor 14' of the equivalent circuit of FIG. 1. A state of the art audio power amplifier 26 is connected to the loudspeaker through line 28 with the other side of the speaker connected to the amplifier ground through line 29 and resistor 24.

A suitable dual trace oscilloscope, not shown, is connected to points E and I of circuit 18, with the oscilloscope ground connected to line 29. A positive voltage pulse E with duration time $T_n$ is applied to amplifier input 30. The gain is adjusted until approximately 6 volts appear at the output line 28.

FIG. 3-A shows the oscilloscope traces which represent the voltage applied to the speaker, while FIG. 3-B shows the traces for the current I flowing through the voice coil.

At some time ($T_a$) the amplifier 26 delivers a voltage of 6 volts to the loudspeaker. At first, due to the delay caused by the electrical inductance 12', no current flows through the coil and therefore no power is flowing through the coil. At a second time T1, enough current is flowing to produce power in the coil. The coil starts to accelerate outward. It reaches a maximum velocity at T2. At T3 the energy flowing through the coil is equal to the force of the suspension. At T3 the coil comes to rest.

The current I, and hence the power in the system, contains a component which is proportional to the voltage generated by the motion of the coil. It is this component which represents an error in the electrical power input to the coil. In a typical loudspeaker enclosed in a ported enclosure, the error component produced by voltage generated by the motion of the coil can equal 50% of the applied voltage.

OBJECTS AND SUMMARY OF THE INVENTION

Accordingly, it is an object of the present invention to provide a control circuit and method of operation which improves the efficiency, performance and power of audio amplifier circuits.

A further object is to provide a circuit and method of the type described which automatically compensates for the power error resulting from the voltage generated by motion of a loudspeaker coil.

Another object is to provide a circuit and method of the type described which achieves compensation for power error from motional voltage without requiring internal connection to existing power amplifiers.

Another object is to provide a circuit and method of the type described which achieves compensation for power error from motional voltage where multiple loudspeakers are connected with a common ground.

The foregoing objects are realized in the present invention by providing an audio amplifier circuit which automatically corrects the power error component produced by the motional voltage generated in the loudspeaker coil. The circuit incorporates a discriminator differential amplifier circuit which generates an output signal proportional to the coil's motional voltage. The output signal is processed in the circuit and applied as a correction voltage to the voltage driving the loudspeaker coil so that the power error component is reduced.

The foregoing and additional objects and features of the invention will appear from the following specification in which the several embodiments have been set forth in detail in conjunction with the accompanying drawings.

BRIEF DESCRIPTION OF THE DRAWINGS

FIG. 1 is a schematic circuit diagram representing the equivalent electrical properties of a prior art loudspeaker circuit.

FIG. 2 is a schematic circuit diagram representing the equivalent electrical properties of a prior art loudspeaker circuit illustrating the effect of generating voltage on electrical power.

FIGS. 3-A and 3-B are graphs showing typical oscilloscope traces of the respective speaker voltage and voice coil current in the equivalent circuit of FIG. 2.

FIG. 4 is a circuit diagram of an audio amplifier circuit according to one embodiment of the invention.

DESCRIPTION OF THE PREFERRED EMBODIMENTS

Figure 5A:
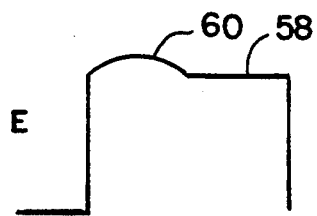
FIGS. 5-A, 5-B and 5-C show typical oscilloscope traces of the circuit of FIG. 4 illustrating the voltage, current and power wave forms with the compensating voltage applied.

FIG. 4 illustrates generally at 32 an audio amplifier circuit according to one embodiment of the invention. The circuit is adapted to drive the voice coil 34 for a loudspeaker 36 of the type having a magnetic driving element. The output of a suitable input source, not shown, is connected through terminal 38 to the non-inverting input 40 of an operational amplifier 42.

The output of amplifier 42 is connected to a power amplifier 44 which in turn is connected to the loudspeaker terminal 46 for driving the voice coil. The other loudspeaker terminal 48 is connected to the current sampling section of a suitable voltage and current sampling network, shown generally at 50.

Circuit 32 further includes a discriminator differential amplifier 52 having its two inputs connected to the output of sampling network 50. The differential amplifier senses the motional voltage generated by coil 34 and produces an output voltage signal proportional to that voltage in a predetermined ratio, in accordance with the values of the resistors. In the illustrated embodiment the circuit components are selected so that the output voltage signal of amplifier 52 is equal to $-1/41$ of the motional voltage (EMot). The circuit generates a correction voltage by connecting the output voltage signal from amplifier 52 to the unity gain inverting input 53 of operational amplifier 42. Amplifier 42 combines the output voltage signal with the drive voltage from terminal 38, and the combined components are directed as a voltage to input terminal 54 of power amplifier 44. Power amplifier 44 is selected to have a gain of 20.6. Thus the output voltage signal component of $-1/41$ EMot is amplified to a $+0.5$ EMot correction voltage.

Figure 5B:
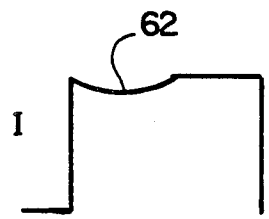
Figure 5C:
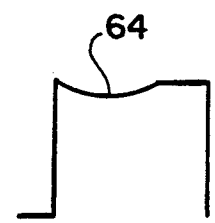

In the operation of circuit 32, the motional voltage of the voice coil is detected by amplifier 52, and the latter's output signal is inverted by amplifier 42 and then amplified by power amplifier 44. This produces a correction voltage of $+0.5$ EMot. This voltage is combined with the drive voltage applied to the non-inverting input 40 of operational amplifier 42. The effect of the correction voltage is illustrated by the wave forms of FIGS. 5-A, 5-B and 5-C. In FIG. 5-A the trace 58 plots voltage E as a function of time, and is similar to the trace of FIG. 3-A from the prior art circuit. The curve 60 represents the peak of $+0.5$ EMot correction voltage. In FIG. 5-B the trace 62 represents the current I as a function of time with the $+0.5$ EMot compensating voltage applied. In FIG. 5-C the trace 64 represents the power with a compensating voltage of 0.5 EMot.

In the audio industry an "ideal" power amplifier is a low impedance source of voltage. In practice, the source resistance of the average power amplifier is usually less than 1-1/100th of the stated output impedance and for all practical purposes may be considered zero. Mathematically, this means that the voltage across the coil will always be the same regardless of conditions inside the loudspeaker. The current, and hence the power, will contain a component that is inversely proportional to the voltage generated by the motion of the coil according to:

$$I = \frac{E - EMot}{R_c} \quad \text{Equation 1}$$

where:
E = voltage applied to the voice coil,
EMot = voltage generated by coil motion, and
$R_c$ = resistance of coil.

In other words, the current through the coil is equal to the voltage applied to the coil minus the voltage generated by the coil divided by the resistance of the coil. The power W is given by the equation:

$$W = \frac{E(E - EMot)}{R_c} \quad \text{Equation 2}$$

Equation 2 translates into:

$$W = \frac{E^2 - E \cdot EMot}{R_c} \quad \text{Equation 3}$$

The expression "$-E \cdot EMot$" is proportional to the power error introduced by the motional voltage generated by the coil.

Circuit 32 operates to add a voltage equal to 0.5 EMot to the applied voltage. The voltage equation then becomes:

$$E = E + 0.5 \, EMot \quad \text{Equation 4}$$

Substituting with Equation 4 the current Equation 1 becomes:

$$I = \frac{E + 0.5 \, EMot - EMot}{R_c} \quad \text{Equation 5}$$

Equation 5 translates into:

$$I = \frac{E - 0.5 \, EMot}{R_c} \quad \text{Equation 6}$$

Substituting with Equation 6, power Equation 2 now becomes:

$$W = \frac{(E + 0.5 \, EMot)(E - 0.5 \, EMot)}{R_c} \quad \text{Equation 7}$$

Equation 7 translates into:

$$W = \frac{E^2 - 0.25 \, EMot^2}{R_c} \quad \text{Equation 8}$$

The error component $C_e$ is now:

$$C_e = \frac{-0.25 \, EMot^2}{R_c} \quad \text{Equation 9}$$

The error component $C_e$ is thus substantially less than $$\frac{-E \cdot EMot}{R_c} \quad \text{Equation 10}$$

which is the subtrahend component from Power Equation 3.

Figure 6:
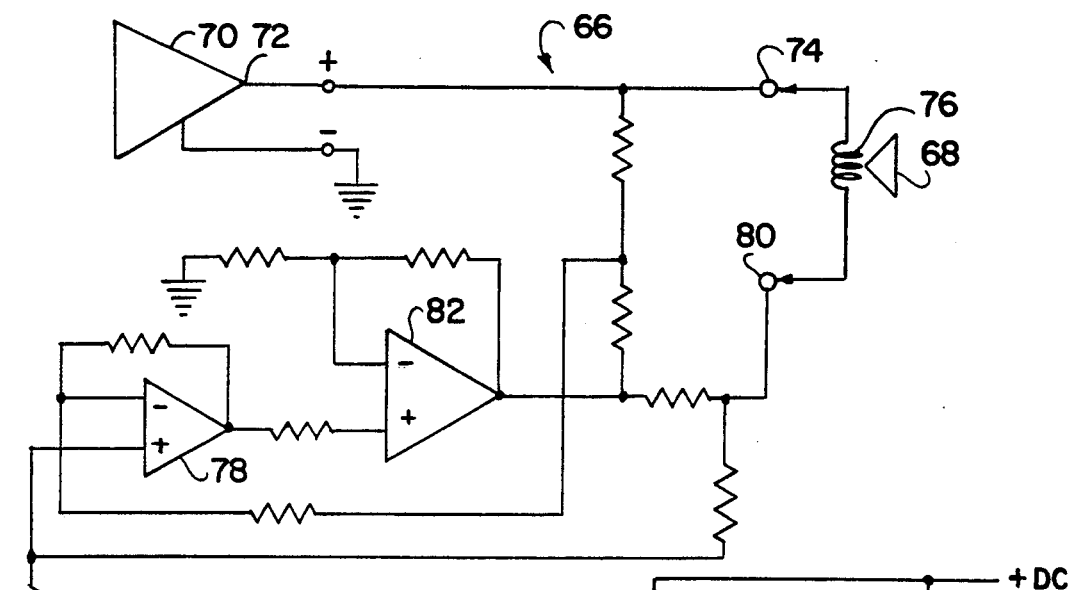
FIG. 6 is a circuit diagram illustrating another embodiment of the invention adapted for use with an existing power amplifier and a loudspeaker system.

FIG. 6 is a schematic diagram illustrating a circuit 66 according to another preferred embodiment of the invention which allows the correctional voltage to be added to a loudspeaker 68 without internal modification to the existing power amplifier 70.

The output terminal 72 of the existing power amplifier 70 is connected to one terminal 74 of voice coil 76 which drives the loudspeaker. A discriminator differential amplifier 78 is connected through the circuit to the second voice coil terminal 80 to detect the motional voltage. Amplifier 78 produces an output equal to $-1/41$ of the motional voltage. The output from the differential amplifier is fed into a power amplifier 82, which preferably has a gain of 20.6. Power amplifier 82 provides a correction voltage of −0.5 EMot which is applied to the loudspeaker along with the drive voltage from existing power amplifier 70 to provide the compensating voltage to the loudspeaker. This embodiment permits the power error to be corrected by installing the system between existing power amplifiers and existing loudspeakers.

Figure 7:
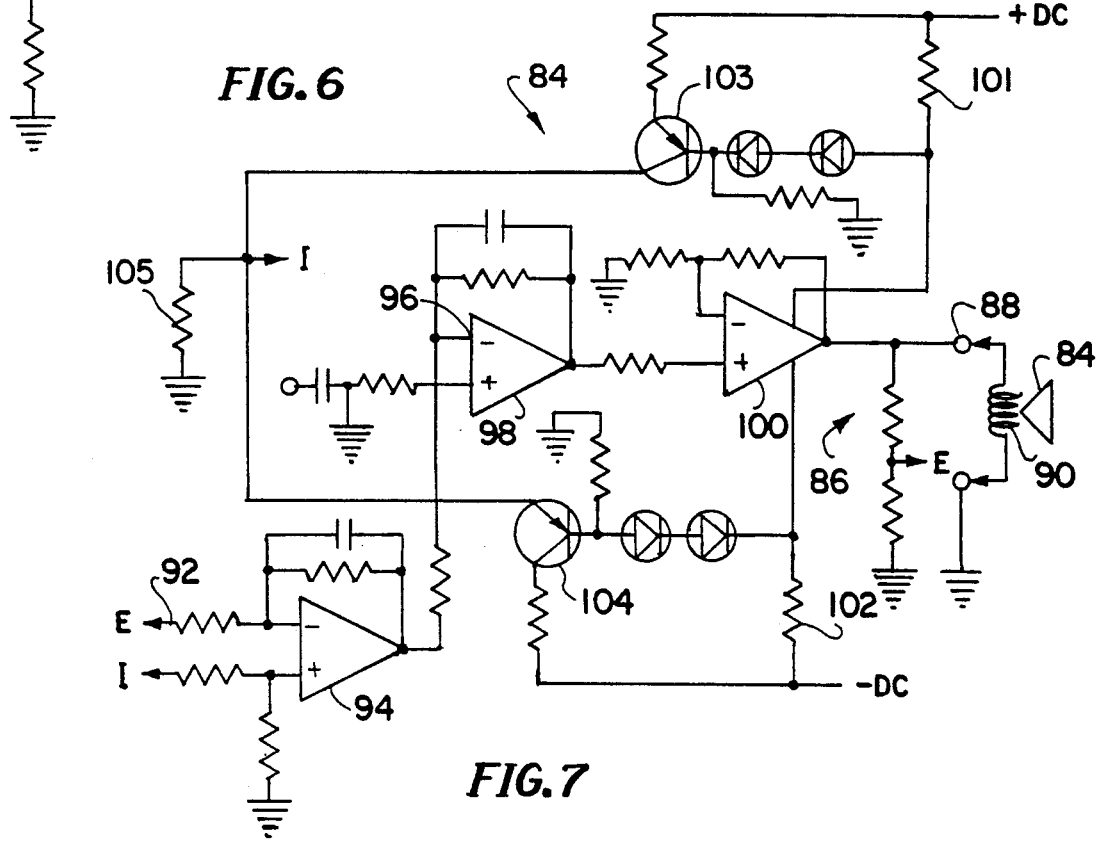
FIG. 7 is a circuit diagram illustrating another embodiment of the invention.

FIG. 7 is a schematic diagram illustrating another embodiment of the invention providing a circuit 84 which eliminates the need of a current sampling resistor in series with the return side of a loudspeaker 84. A resistance circuit 86 is connected in parallel with the input terminal 88 of the voice coil 90. Circuit 86 connects at tap E through input circuit 92 leading into a discriminator differential amplifier 94, and provides the voltage sampling current. Sampling resistors 101 and 102 in conjunction with transistors 103 and 104 provide a voltage across resistor 105 that is proportional to the current supplied to voice coil 90 by power amplifier 100.

These voltages when combined in differential amplifier 94 produce an output voltage proportional to: −(1/141 EMot). Differential amplifier 94 operates in the manner described for the embodiment of FIG. 4 and produces an output voltage signal equal to −1/41 of the motional voltage (EMot) of the voice coil. This voltage signal is directed through the circuit into the unity gain inverting input 96 of an operational amplifier 98. The output of amplifier 98 is directed to power amplifier 100, which has its output connected to voice coil input terminal 88. This embodiment is preferred when multiple loudspeakers with a common ground are to be connected in the system, as in the case of headphones.

Figure 8:
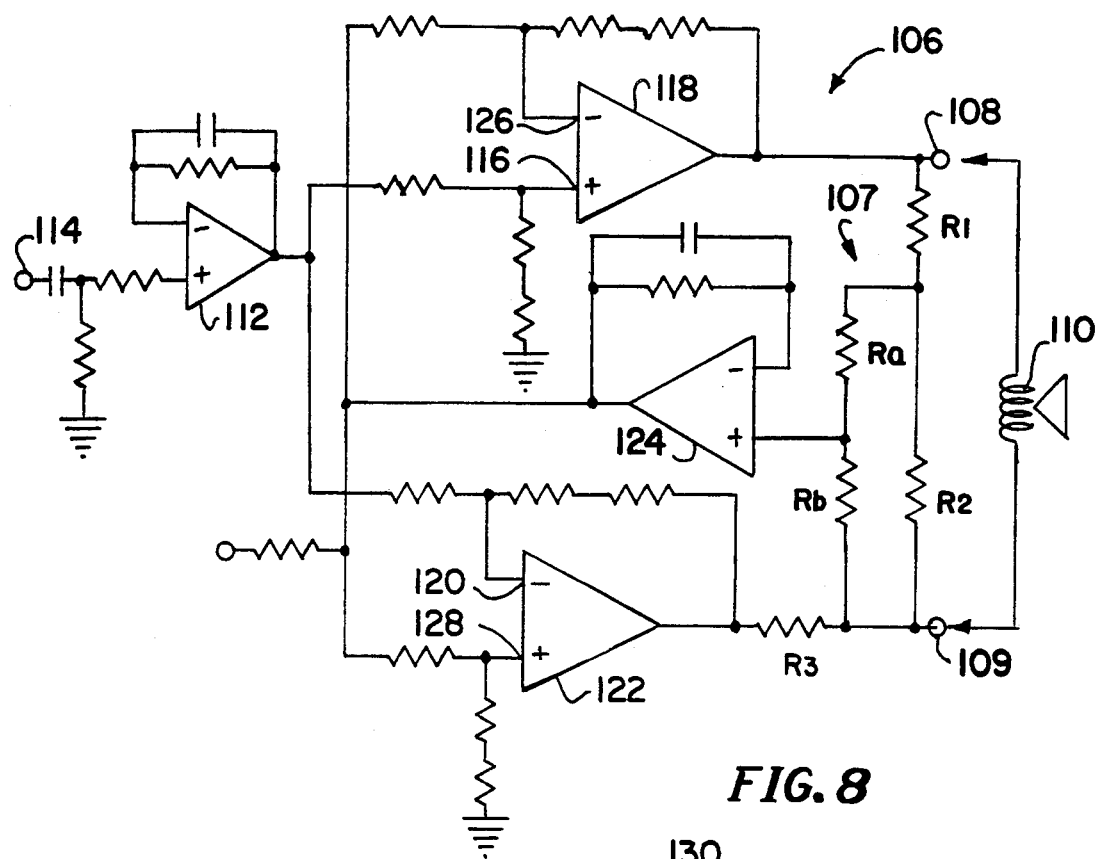
FIG. 8 is a circuit diagram illustrating another embodiment of the invention.

FIG. 8 shows an embodiment providing a circuit 106 in which the motional voltage is extracted by a resistive circuit 107 between the terminals 108 and 100 of loudspeaker voice coil 110. This configuration is preferred when the power amplifier arrangement is of the differential or bridge type. A unity gain non-inverting amplifier (buffer) 112 is connected in the circuit to amplify the input signal from the drive voltage applied at terminal 114. The output from amplifier 112 is applied to the positive input 116 of a power amplifier 118. The output from amplifier 118 connects with terminal 108 and supplies the loudspeaker with the non-inverted portion of the drive voltage. Non-inverting 112 amplifier simultaneously supplies the amplified input signal to the inverting input 120 of a power amplifier 122. Power amplifier 122 is connected in the circuit through terminal 109 to supply the inverted portion of the drive voltage to the loudspeaker. An amplifier 124 is also connected in the circuit as a unity gain non-inverting amplifier (buffer).

Summing resistors Ra and Rb combine the voltage sample produced by resistors R1 and R2 and the current sample produced by R3 and the DC resistance of the loudspeaker. The output of amplifier 124 is −1/82 of the motional voltage EMot generated by the loudspeaker. This output is connected to the inverting input 126 of power amp 118 as well as the non-inverting input 128 of power amp 122. This configuration supplies an output of 0.5 EMot to the loudspeaker 1/82 EMot×20.6−(1/82 EMot× −20.6).

Figure 9:
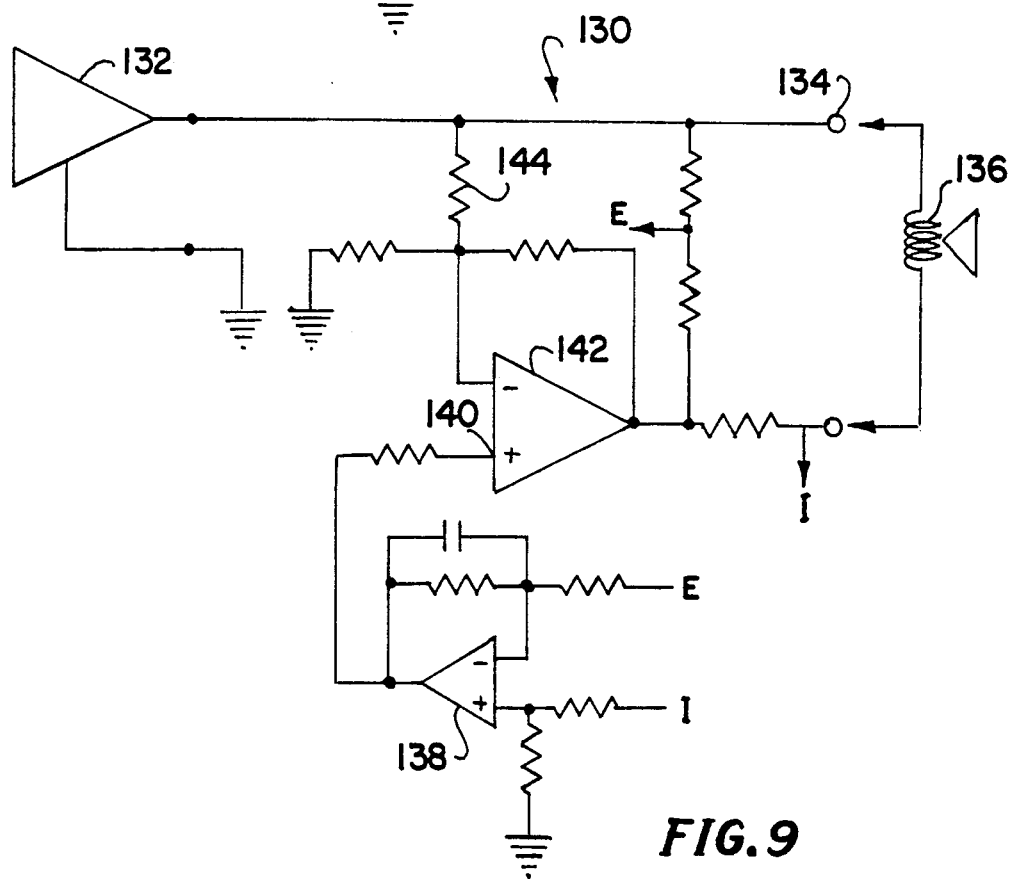
FIG. 9 is a circuit diagram illustrating another embodiment of the invention.

FIG. 9 is schematic diagram illustrating another embodiment providing a circuit 130 in which it is possible to increase the power output of an existing power amplifier 132 and provide power error compensation at the same time. The output of power amplifier 132 is applied to input terminal 134 of loudspeaker voice coil 136. The motional voltage EMot from the voice coil is sensed by a discriminator differential amplifier 138, the output of which supplies a correctional voltage of 0.5 EMot to the non-inverting input 140 of power operational amplifier 142. The output of amplifier 142 is then applied through the circuit to the loudspeaker along with the drive voltage from the existing power amplifier 132. A portion of the output voltage from amplifier 132 is simultaneously applied to the inverting input of amplifier 142 by resistor 144. This increases the maximum signal voltage to voice coil 136.

All of the embodiments of FIGS. 4-9 operate the same way mathematically. The difference is primarily the method of extracting the EMot component. If one considers that a loudspeaker with a motional voltage of 50% of applied voltage has an instantaneous power error of 50% without correction, the effect of adding the correction voltage will reduce this error to approximately 6.25%. The reduction of power error for all three embodiments will be the same.

It should be noted that the error component that remains after compensation (0.25 Emot$^2$) is exponential. By optimizing enclosure design to minimize cone motion, the compensation method of this invention becomes even more effective. For instance, a speaker with a 50% motional voltage component results in a 6.25% error remaining with compensation. This represents an 87% reduction of error. On the other hand, a speaker with a motional voltage of 20% will produce an error of 1% with compensation. This represents a 95% reduction of error.

While the foregoing embodiments are at present considered to be preferred it is understood that numerous variations and modifications may be made therein by those skilled in the art and it is intended to cover in the appended claims all such variations and modifications as fall within the true spirit and scope of the invention.

What is claimed is:

1. In an audio amplifier system which includes a power amplifier that is a low impedance source of voltage for powering the magnetic driving element in a loudspeaker system, a circuit for correcting the power error component resulting from EMot where EMot is the motional voltage produced by said magnetic driving element in the loudspeaker system, the circuit comprising the combination of input means for applying said source of voltage as an input into said loudspeaker system for powering the magnetic driving element, discriminatory differential amplifier means for detecting the magnitude of EMot generated by said magnetic driving element, and additional means for adding 0.5 EMot to said input into said loudspeaker system.

2. A circuit as in claim 1 in which said loudspeaker system has positive and negative terminals, said input means applies said source of voltage as a positive voltage input to said positive terminal, and said additional means applies positive 0.5 EMot to said positive terminal.

3. A circuit as in claim 1 in which said loudspeaker system has positive and negative terminals, said input means applies said source of voltage as a positive voltage input to said positive terminal, and said additional means applies negative 0.5 EMot to said negative terminal.

* * * * *